United States Patent
Creasy et al.

(10) Patent No.: US 7,060,348 B2
(45) Date of Patent: Jun. 13, 2006

(54) FLAME RETARDANT, ELECTRICALLY CONDUCTIVE SHIELDING MATERIALS AND METHODS OF MAKING THE SAME

(75) Inventors: Larry Creasy, St. Clair, MO (US); Kevin Hug, O'fallon, MO (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 615 days.

(21) Appl. No.: 10/093,667

(22) Filed: Mar. 8, 2002

(65) Prior Publication Data

US 2004/0157955 A1    Aug. 12, 2004

(51) Int. Cl.
   *B32B 3/26* (2006.01)
   *C09K 21/00* (2006.01)

(52) U.S. Cl. ............... 428/304.4; 428/306.6; 428/308.4; 428/312.8; 428/315.7; 428/317.9; 428/323; 428/457; 428/688; 428/423.1; 428/704; 428/920; 252/602; 252/604; 252/606; 252/610

(58) Field of Classification Search ............ 428/304.4, 428/306.6, 308.4, 312.8, 315.7, 317.9, 323, 428/457, 423.1, 688, 704, 920; 252/602, 252/604, 606, 610

See application file for complete search history.

(56) References Cited

U.S. PATENT DOCUMENTS

| | | | |
|---|---|---|---|
| 4,857,668 A | 8/1989 | Buonanno ................ 174/35 |
| 4,965,296 A * | 10/1990 | Hastings ................. 523/179 |
| 5,182,163 A * | 1/1993 | Wheat et al. ............ 442/203 |
| 5,910,524 A * | 6/1999 | Kalinoski ............... 523/215 |
| 6,248,393 B1 | 6/2001 | Bunyan et al. .......... 427/77 |
| 6,387,523 B1 | 5/2002 | Bunyan et al. .......... 428/457 |
| 2002/0010223 A1* | 1/2002 | Botrie .................... 521/54 |
| 2003/0036326 A1 | 2/2003 | Takagi et al. ........... 442/222 |

FOREIGN PATENT DOCUMENTS

| | | |
|---|---|---|
| EP | 0 917 419 | 5/1999 |
| EP | 1094257 | 4/2001 |
| JP | 2001-11774 | 1/2001 |
| WO | 9918765 | 4/1999 |
| WO | 0162061 | 8/2001 |

* cited by examiner

*Primary Examiner*—Ling Xu
(74) *Attorney, Agent, or Firm*—Harness, Dickey & Pierce, P.L.C.

(57) ABSTRACT

Flame retardant EMI shielding materials with improved retention of shielding properties are disclosed. The shielding materials are provided with a dispersed flame retardant on the surfaces of the internal interstices. Methods of making the flame retardant shielding materials are also disclosed.

28 Claims, 4 Drawing Sheets

Far Field Shielding Effectiveness (SE) of Conductive Foam (1.75mm)

Force Displacement Graph of Conductive Foam (1.75mm)

FLAME RETARDANT, ELECTRICALLY CONDUCTIVE SHIELDING MATERIALS AND METHODS OF MAKING THE SAME

FIELD OF THE INVENTION

The present invention relates to flame retardant electrically conductive EMI shielding materials, and more particularly to flame retardant electrically conductive EMI shielding materials that exhibit improved retention of shielding properties.

BACKGROUND OF THE INVENTION

A common problem in the operation of electronic devices is the generation of electromagnetic radiation within the electronic circuitry of the equipment. Such radiation results in "electromagnetic interference" or "EMI" and thus interferes with the operation of other electronic devices with a certain proximity.

A common solution to ameliorate the effects of EMI has been the development of shielding materials capable absorbing and/or reflecting EMI energy. These shielding materials are employed to localize EMI within its source, and to insulate other devices proximal to the EMI source. In fact, in the United States, EMI shielding materials must comply with the commercial Federal Communication Commission (FCC) EMC regulations to be sold as EMI shielding materials.

Moreover, an objective for all EMI shielding materials to be used in electronic devices is that they must not only comply with FCC requirements, but also should also meet Underwriter's Laboratories (UL) standards for flame retardancy. In this context, EMI shielding materials need be made flame retardant, i.e., achieving a rating of V-0 under UL Std. No. 94, "Tests for Flammability of Plastic Materials for Parts in Devices and Appliances" (1991), without compromising the shielding properties necessary for meeting EMI shielding requirements.

Several attempts have been made to provide EMI shielding materials (or gaskets) that exhibit flame retardancy. Typically, an EMI gasket is provided with a distinct flame retardant layer through the use of a highly viscous flame retardant material which is subsequently cured. For example, U.S. Pat. No. 4,857,668, which is directed to a conductive fabric-on-foam EMI gasket discloses a distinct flame retardant urethane layer being disposed on the interior side of the conductive fabric. Likewise, U.S. Pat. No. 6,248,393, which is also directed to a conductive fabric-on foam EMI gasket, discloses the formation of distinct flame retardant layer on the interior side of the conductive fabric by the delimited penetration of the fabric with a highly viscous flame retardant composition. The delimited penetration of the fabric allows the exterior of the gasket to remain substantially coating free and thus conductive. However, the coated portions of the fabric lose conductivity due to the flame retardant coating. Thus, while these gasket materials exhibit surface resistivity, any z-axis conductivity or bulk resistivity exhibited by these materials will be drastically diminished due to the flame retardant.

Thus, there is a need in the art for EMI shielding materials that are flame retardant and exhibit z-axis conductivity or bulk resistivity suitable for electromagnetic shielding applications. Accordingly, it is an object of the present invention provide flame retardant EMI shielding materials that exhibit z-axis conductivity or bulk resistivity and methods of producing these materials.

SUMMARY OF THE INVENTION

The present invention provides a flame retardant electrically conductive EMI shielding material which includes a porous material having internal interstices where the internal surfaces of the interstices are electrically conductive, and contain an effective amount of a flame-retardant. Preferably, the surfaces of the interstices are electrically conductive due to at least one conductive layer being disposed on internal surfaces, with a metallized layer being more preferred. Metals for the metallized layer include copper, nickel, silver, palladium, platinum, nickel-plated-silver, aluminum, tin, and alloys thereof. In one embodiment, the flame retardant is in the form of a particulate dispersed throughout the interstices of the shielding material. In this embodiment, the particulate preferably occupies no more than about 30% of the total internal surface area defined by the interstices, with no more than about 20% being more preferable, and with no more than about 10% being even more preferable. In another embodiment, the flame-retardant is in the form of a coating on the internal surfaces of the interstices. In this embodiment, the coating preferably has a thickness of about 12 microns or less, with about 5 microns or less being more preferable, and with about 2 microns or less being even more preferable. In either of these embodiments, the shielding material is preferably substantially free of occluded interstices. A preferred porous material is an open-cell foam having at least one metallized layer throughout, which can optionally include a porous scrim. An example of open-cell foam is a polyurethane foam.

The shielding materials of the invention advantageously exhibit bulk resistance and flame retardance. The shielding material preferably has a bulk resistivity of about 20 ohm·cm or less, with about 1 ohm·cm or less being more preferable, and with about 0.05 ohm·cm or less. The effective amount of flame retardant preferably provide the shielding material with at least one of following UL94 flame ratings: at least HF-1; at least HB; at least V2; at least V1; or V0. An example of a flame retardant to be used is a phosphorous-based flame retardant such as an ammonium phosphate salt. In another embodiment, the flame retardant is halogen free. The flame retardant can optionally include a polymeric carrier such as water-soluble or water-dispersible polymer. Lastly, the shielding materials of the invention preferably exhibit an average shielding effectiveness of at least about 65 decibels.

The present invention also provides a method of producing the above described shielding materials. The method includes impregnating a porous material having internal interstices, the internal surfaces of which are electrically conductive, with a flame retardant to provide an effective amount of the flame retardant on the internal surfaces of the interstices. The flame retardant is preferably in the form an aqueous composition, which can optionally include a polymeric carrier such as water-soluble or water-dispersible polymer. Preferably, the solvent for the aqueous composition is water and water-miscible organic solvents and can optionally be free of a non-water-miscible organic solvent. The method preferably includes curing the impregnated shielding material. Advantageously, the method of providing an effective amount of the flame retardant results in no more than about a 10 fold increase in bulk resistivity, with no more than a 1 fold increase in bulk resistivity being more preferable. Other preferred embodiments are as described above.

Accordingly, the present invention provides shielding materials that advantageously exhibit flame retardance and electrical properties previously unattainable. These and other advantages of the invention will be more readily apparent from the description set forth below.

DETAILED DESCRIPTION OF THE INVENTION

Figure 1:
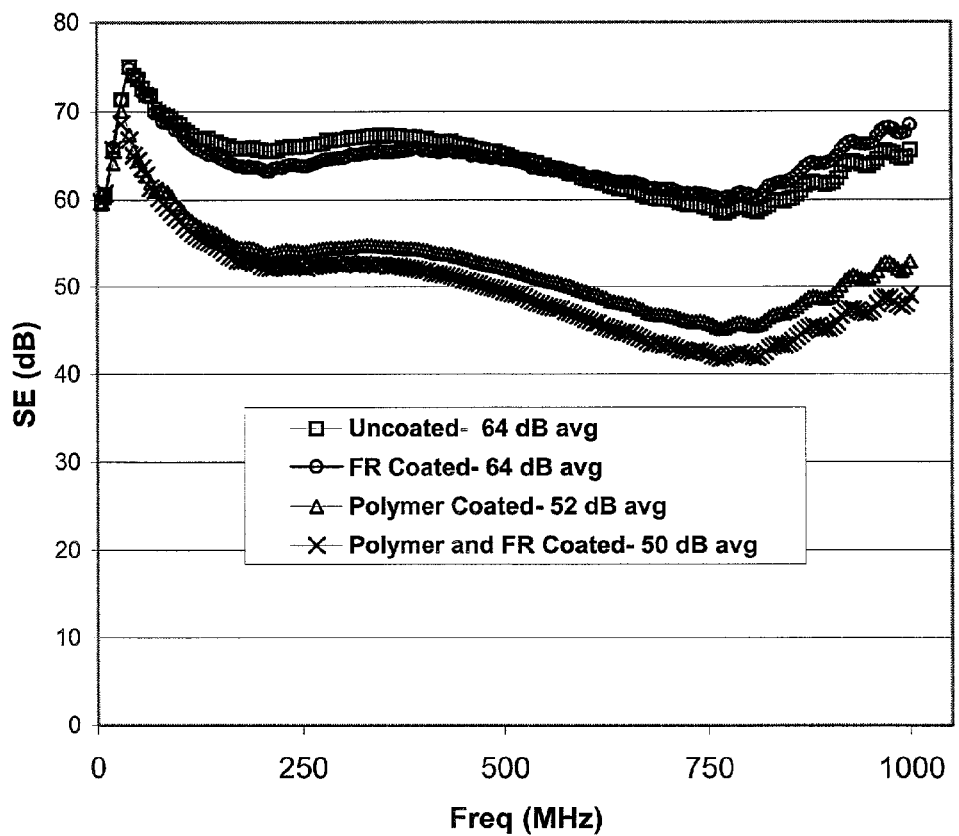
FIG. 1 is a plot graph illustrating far field shielding effectiveness (SE) as a function of frequency for shielding materials (1.75 mm foam) with a dispersed flame retardant in accordance with the invention: uncoated control (-□-); polymer coated (-▲-); flame retardant ("FR") coated (-●-); and polymer and flame retardant (-✳-).

In accordance with the invention, flame retardant electrically conductive EMI shielding materials are provided that exhibit flame retardance without a substantial decrease in shielding capacity. Advantageously, it has been found that conductive shielding materials can be rendered flame retardant without a substantial degradation of electrical properties which has been found to occur with the conventional application of flame retardants.

The flame retardant shielding materials of the present invention include a porous material having internal interstices in which the internal surfaces of the interstices are electrically conductive and include an effective amount of a flame-retardant. Porous materials having internal interstices (or pores) with electrically conductive surfaces are well known in the art and are commonly used for EMI shielding applications. The internal surfaces of the interstices (or pores) define an "internal surface area" through an interconnected network of interstices or pores exhibited throughout the material. In one preferred embodiment, the porous material is an open cell polymeric foam, such as a foam made from a thermoplastic elastomer (e.g., a polyurethane foam). The polymeric foams are preferred due to their deformable nature which is beneficial for certain shielding applications. In a more preferred embodiment, the foams have about 5 to 120 pores per inch, with about 50 to 70 pores per inch being more preferred.

In shielding applications, the internal surfaces of the porous materials are rendered electrically conductive by depositing at least one layer of a conductive material throughout the internal surface area of the material. Typically, electrically-conductive in shielding applications means a surface resistivity of about 300 ohm/square or less. The conductive material can be in the form of a conductive filler, a metal layer or a conductive non-metal layer. Examples of conductive fillers used in EMI shielding applications include, but are not limited to, carbon graphite, metal flakes, metal powder, metal wires, and metal plated particles, or combinations thereof. The porous material is impregnated with the filler to disperse the filler throughout the material. The metallized layers are typically applied by plating or sputtering which are well known in the art. Metals often used to render the porous materials electrically conductive include, but are not limited to, copper, nickel, silver, palladium, platinum, nickel-plated-silver, aluminum, tin, or an alloy thereof. Examples of non-metallic materials to render the internal surface area of the porous materials conductive include, but are not limited to, inherently conductive polymers such as d-polyacetylene, d-poly(phenylene vinylene), and d-polyaniline, and combinations thereof.

The porous shielding materials of the invention can also include a scrim or outer fabric layer to provide abrasion resistance to the shielding material. The scrim can be in the form of woven, non-woven or knitted fabrics. In either case, the scrim is porous material.

The porous shielding materials should preferably exhibit a high degree of shielding effectiveness. In this regard, the shielding effectiveness of a shielding device is a measure of the attenuation of a signal transmitted through the material. In the accordance with the invention, the porous shielding material preferably exhibits an average shielding effectiveness of at least 65 decibels (dB) measured from 1 MHz to 1 GHz by a transfer impedance test. More preferable, the average shielding effectiveness (SE) is at least about 80 dB, with at least about 90 dB being more preferred.

In a particularly preferred embodiment, the porous material to be used in accordance with the invention is a metallized foam (i.e., a foam material in which the internal surface area of the foam has at least one metal layer deposited thereon.) Examples of metallized foams are commercially available from a variety of sources. One commercial provider is Eltech System Corp., located in Chardon, Ohio. Another commercial provider is Laird Technologies Inc., located St. Louis, Mo.

In accordance with the present invention, the internal surfaces of the porous material is provided with an effective amount of a flame retardant. Stated otherwise, the flame retardant is dispersed throughout the material by being disposed on the surfaces of the interconnected interstices (or pores). In the context of the present invention, an "effective amount" is an amount of the flame retardant that provides the shielding material with at least horizontal flame rating while at the same time retaining a z-axis conductivity or bulk resistivity sufficient for EMI shielding applications. Flame retardance is determined using the Underwriters Laboratories Standard. No. 94, "Tests for Flammability of Plastic Materials for Parts in Devices and Appliances" (5$^{th}$ Ed., Oct. 29, 1996). In a more preferred embodiment, the effective amount provides the shielding material with a UL94 flame rating of at least HF-1 or HB. More preferable is a UL94 vertical flame rating of at least V1, V2 or V0. Likewise, the shielding material preferably exhibits a bulk resistivity (when compressed by 50 percent) of about 20 ohm·centimeters (Ω·cm) or less, with about 1 Ω·cm or less being more preferred, and about 0.05 Ω·cm or less being even more preferred. One method of ascertaining bulk resistivity is by using the ASTM D991 standard. As will be apparent to one skilled in the art, the actual amount of the flame retardant to be dispersed throughout the material is variable due to variety of factors. Generally, the amount of the flame retardant dispersed throughout the material should be about 10 ounces per square yard (opsy) or less, with about 5 opsy or less being more preferred, with about 3 opsy or less being even more preferred. However, these parameters can be easily ascertained by one skilled in the art following the teachings of the invention.

The flame retardant materials of the invention have the flame retardant disposed on the internal surfaces of the material in a variety of forms. In one embodiment, the flame retardant is dispersed throughout the material as a relatively thin coating. In another embodiment, the flame retardant is dispersed throughout the material as a particulate adhered to the internal surfaces. While not wishing to be limited by theory, it is believed that the property of the flame retardant shielding materials of the invention being substantially free of occluded interstices (or pores) due to the dispersed nature of the flame retardant facilitates a dramatic retention of the electrical properties of the shielding material. Electrical contact between the electrically conductive surfaces of the shielding material is thus allowed to occur especially during deformation. This is the contrary of prior flame retardant EMI shielding materials in which the flame retardant coatings are of such thicknesses that blockage or occlusion of the interstices or pores occur thereby reducing electrical contact. Reference to "substantially free" of occluded interstices (or pores) means that less than a majority of the interstices (or pores) of the porous material provided with the flame retardant are occluded or blocked. In a more preferred embodiment, less than about 25 percent of the interstices (or pores) are occluded, with less than about 10 percent being even more preferred.

In one particular embodiment, the flame retardant is in the form of particulate disposed on the internal surfaces. In a more preferred embodiment, the particulate occupies about 30 percent or less of the total internal surface area of the shielding material provided with the flame retardant, with about 20 percent or less being preferred, and about less than 10 percent being more preferred. In another embodiment, the flame retardant is in the form of a thin coating having a thickness of about 12 microns or less, with about 5 microns or less being more preferred, and about 2 microns or less being even more preferred.

Flame retardants to be used include any flame retardant such as halogen-based and non-halogen based flame retardants. In one embodiment, a phosphate-based flame retardant is used. Examples of phosphate-based flame retardants to be used are ammonium phosphates, alkyl phosphates, phosphonate compounds, or a combination thereof. Representative examples of flame retardants to be used include, but are not limited to, decabromodiphenyloxide, decabromodiphenylether, antimony trioxide, hexabromocyclododecane, ethylenebis-(tetrabromophthalimide), bis(hexachlorocyclopentadieno)cyclooctane, chlorinated parrafin, aluminum trihydrate, magnesium hydroxide, zinc borate, zinc oxidetri-(1,3-dicholoroisopropyl) phosphate, phosphonic acid, oligomeric phosphonate, ammonium polyphosphate (APP), ammonium dihydrogen phosphate (ADP), triphenyl phosphate (TPP), diammonium and monoammonium phosphate salt or any mixture thereof. In another embodiment, the flame retardant is substantially free of halogens to provide a halogen-free flame retardant material. Particular examples of commercially available flame-retardants are sold by Apex Chemical Company located in Spartanburg, S.C. and Akzo Nobel located in Dobbs Ferry, N.Y.

In another embodiment, a polymeric coating is optionally disposed between the internal surface of the interstices (or pores) and the flame-retardant. It has been advantageously found that the shielding material may be provided with a polymeric coating without a substantial increase in flammability. The amount provided to the shielding material is any amount that does not substantially decrease the shielding effectiveness of the material while at the same time increasing flammability. Examples of polymeric materials to be used are homopolymers, copolymers, and mixtures thereof such as poly(ethylene), poly(phoshphazene), poly(acrylonitrile), poly(styrene), poly(butadiene), plasticized poly(vinyl chloride), polychloroprene (Neoprene), polycarbonate, poly(vinyl acetate), alkylcelluloses, poly(ethylene terephthalate), phosphate and polyphosphonate esters, epoxy resins, copolymers of styrene and maleic anhydride, melamine-formaldehyde resins, and urethanes. Preferably, the polymeric material for the coating is a water-soluble or water-dispersible polymer. In one particular embodiment, the internal surface area of the porous material is provided with a urethane polymer coating with a dried coating weight of less than about 1 ounce per square yard (opsy), with less than about 0.6 opsy being more preferred. As will be apparent to one skilled in the art, the actual amount of the polymeric coating is variable so long as the shielding effectiveness and flammability of the shielding material is not detrimentally affected.

The flame retardant shielding materials of the invention are prepared by impregnating the above-described shielding materials with a flame retardant under conditions sufficient to dispose an effective amount of the flame retardant on the internal surfaces of the interstices. The porous materials are impregnated using any technique known in the art. For example, the porous material can be immersed in a liquid composition containing the flame retardant. Other methods of impregnating the porous materials with flame retardant include spraying, air knife coating, top and bottom direct coating, slot die (extrusion) coating, knife over roll (gap) coating, metering rod coating, and dual reverse roll coating.

In one preferred embodiment, the porous material is impregnated by immersing the material in a liquid flame retardant composition of sufficient viscosity and for a time sufficient for the composition to diffuse throughout the material. The excess flame retardant is removed (e.g., by nipping the impregnated material) to minimize the occurrence of occlusions, after which the impregnated material is cured by any technique known in the art. More preferably, an aqueous composition is used for impregnating a polymeric foam to minimize potential swelling of the foam material. In the context of the invention, "aqueous" means that the majority of the solvent for the liquid composition is water or a combination of water and water-miscible organic solvents. More preferable, the solvent is free of non-water miscible organic solvents. In one embodiment, curing is effected by drying the material (e.g., at ambient temperature or with an oven). However, as will be apparent to one skilled in the art, the choice of curing means is dependent on the components contained in the composition.

Liquid flame retardant compositions to be used for impregnating the foam material are readily available from variety of suppliers such as Apex Chemical Company and Akzo Nobel, which are described above. The viscosity of the liquid composition should be sufficiently low to readily diffuse (i.e., permeate) through the porous material. Preferably, the liquid flame retardant composition should have a viscosity of about 1000 centapose per second (cps) or less, with about 500 cps or less being more preferred, and about 100 cps or less being even more preferred. Thus, the viscosity of the commercially available flame retardants may be adjusted to facilitate diffusion throughout the porous material in addition to altering coating weights. Optionally, liquid composition can also include a wetting agent to facilitate diffusion of flame retardant composition. Wetting agents to be used includes, but are not limited to, surfactants (e.g., cationic, anionic, non-ionic and zwitterionic). The wetting agent can be incorporated in the composition in an amount of about 10 percent by weight (wt. %) or less, with about 4 wt. % or less being preferred, and about 2 wt. % or less being even more preferred.

In another embodiment, the liquid flame retardant compositions also include a polymeric carrier to facilitate the formation of a thin flame retardant coating on the internal surfaces of the interstices (or pores) of the porous shielding material. Polymeric carriers to be used include the polymeric materials described above, with water-soluble or water-dispersible polymers being preferred. In one particular embodiment, a water-based urethane polymer composition is utilized. The ratio of flame retardant to polymeric carrier should range from about 1:1 to about 5:1 on a dried weight basis, with ratio of about 2:1 to about 3:1 on a dried weight basis being more preferred.

As previously described, the shielding materials can be optionally provided with a polymeric coating without increasing the flammability of the shielding material. In this embodiment, the shielding material is first impregnated with the polymeric coating composition. The excess polymeric coating material is removed from impregnated shielding material to minimize occluded interstices and optionally cured (e.g., dried) prior to the application of the flame retardant.

In accordance with the invention, the step of impregnating the porous shielding material with the flame retardant results in the flame retardant being dispersed throughout the material. One significant advantage of the method of the present invention is that equivalent or greater quantities of flame retardant can be disposed in the material as compared prior methods in which only a distinct portion of the material is provided with a flame retardant. The distinct layers of flame retardant produced with prior methods significantly reduces the z-axis conductivity or bulk resistivity of the material. In a preferred embodiment of the invention, the method of providing the shielding material with the flame retardant should result in no more than a 10 fold increase in bulk resistivity for the shielding material, with no more than about a 1 fold increase in bulk resistivity being preferred, and no more than a 0.1 fold increase being even more preferred. Likewise, the average shielding effectiveness of the shielding material once provided with the flame retardant preferably decreases by no more than 30 percent, with 20 percent or less being more preferred, and 10 percent or less being even more preferred.

The following non-limiting examples illustrate the unique properties of the flame retardant foams produced in accordance with the invention.

EXAMPLES

Example 1

Commercially available wholly metallized fabric-on-foam shielding materials were coated with undiluted Apex 911 flame retardant (viscosity of 25 cps) available from Apex Chemical Company. The fabric-on-foam shielding materials in two different thicknesses (1.0 mm and 3.2 mm) were taken from line runs of Laird Technologies fabric-on-foam products CF0040-4 and CF0125-4, respectively. 5"×11" sheets of conductive foam were dipped in a 5"×12" pan containing the flame retardant. The foam sheets were then nipped with a dual rubber nip roller at 10 psi. After padding, the coated foam sheets were dried in an oven at 110 degrees Celsius for approximately 25 minutes. The coated foam sheets were visually observed to be free of occluded pores. The coating weights of the Apex 911 were determined to be 4.34 opsy for the 3.2 mm material, and 1.76 opsy for the 1.0 mm material. Specimens were cut into 5"×½" bar samples and subjected to the UTL94 Vertical Burn (V) test. The burn test results are listed in Table 1.

TABLE 1

UL 94-V Flammability Test Results

| 1.0 mm FR conductive foam | | | | | 3.2 mm FR conductive foam | | | | |
|---|---|---|---|---|---|---|---|---|---|
| Sample | T1 | T2 | T3 | Pass/Fail | Sample | T1 | T2 | T3 | Pass/Fail |
| 1 | 0 | 0 | 0 | PASS | 1 | 0 | 0 | 0 | PASS |
| 2 | 0 | 0 | 0 | PASS | 2 | 1 | 0 | 0 | PASS |
| 3 | 0 | 0 | 0 | PASS | 3 | 0 | 0 | 0 | PASS |
| 4 | 0 | 0 | 0 | PASS | 4 | 7 | 0 | 0 | PASS |
| 5 | 3 | 0 | 0 | PASS | 5 | 0 | 0 | 0 | PASS |
| Total Afterflame | 3 | | | | Total Afterflame | 8 | | | |
| Test Result | V-0 | | | | Test Result | V-0 | | | |

Both samples of the flame retardant fabric-on-foam passed the UL94 Vertical Burn Test with a V0 rating. The V0 rating was also independently confirmed for these materials by Underwriters Laboratories. In-house V0 burn ratings were also obtained with other flame retardants Apex 2080 and Fyrol FR-2 (Akzo Nobel) applied in the manner described above.

Example 2

Samples of 1.75 mm thick conductive foam commercially available from Eltech Systems Corp. of Chardron, Ohio. were obtained and treated in accordance with the invention. The conductive foams were carbon coated polyurethane foam plated with 30 grams/square meter of nickel, which is sold under the product code number 2620. One group of foam samples (n=5) were not treated and served as a control. A second group of 5"×7" sheets of conductive foam (n=5) were dipped in a 5"×12" pan containing undiluted Flame Proof 911 coating by Apex Chemical Co and 1 weight percent (wt. %) Pentrapex 1924 (wetting agent) also available from Apex Chemical Company. The foam sheets were then nipped with a dual rubber nip roller at 10 psi. After padding, the coated foam sheets were dried at 110 degrees Celsius for approximately 25 minutes. A third group of foam samples (n=5) were first coated with a water-based urethane coating (Solucote 1024-4C by Soluol Chemical Co.). 5"×7" sheets of conductive foam were submerged in a 5"×12" plastic pan containing a solution of diluted water-based urethane coating (200 g urethane (Solucote) in 800 g D.I. water). After the foam sheets were dipped in the urethane coating, they were padded with a dual rubber nip roller at 10 psi. After padding, the coated foam sheets were dried in an oven at 140 degrees Celsius for approximately 20 minutes. After the samples dried, they were dipped in undiluted Flame Proof 911 following the above described procedure and dried with the oven temperature at 110 degrees Celsius. A fourth group of foam samples (n=5) were coated with the urethane only. The coated samples were visually observed to be free of occluded pores. Specimens from three (3) groups (uncoated, 911 coated, and urethane coated plus 911 coated)

were cut into 5" long×½" wide bar samples and subjected to the UL94 vertical (V) burn test. The results of the burn tests are listed in Table 2. The specimens were also analyzed for coating weights, surface resistivities (4-point), shielding effectiveness (SE), and force resistance characteristics. The coating weights and surface resistivities are listed in Table 3. The shielding effectiveness and force resistance characteristics (i.e., bulk resistance as a function of compression) are graphically depicted in FIGS. 1 and 2, respectively.

foam product CF0060-4. The samples of the material were impregnated following the procedure described in Example 2 with the exception that the 911 flame retardant included 0.2 wt. % Pentrapex 1924. The coated samples were visually observed to be free of occluded pores. A specimen of sample 3 (urethane coating+911 coating) was also examined under an electron microscope to evaluate the dispersed nature of the flame retardant. The internal surfaces of the pores were observed to contain an adhered particulate occupying less

TABLE 2

| Control-Eltech 30 g Ni (Uncoated) | | | | | Eltech 30 g Ni (911 Coated) | | | | | Eltech 30 g Ni (Urethane and 911) | | | | |
|---|---|---|---|---|---|---|---|---|---|---|---|---|---|---|
| Sample | T1 | T2 | T3 | P/F | Sample | T1 | T2 | T3 | P/F | Sample | T1 | T2 | T3 | P/F |
| 1 | 4-BTC | | | F | 1 | 0 | 0 | 0 | P | 1 | 1 | 0 | 0 | P |
| 2 | 4-BTC | | | F | 2 | 0 | 0 | 0 | P | 2 | 0 | 0 | 1 | P |
| 3 | | | | NT* | 3 | 0 | 0 | 0 | P | 3 | 0 | 0 | 0 | P |
| 4 | | | | NT* | 4 | 1 | 0 | 0 | P | 4 | 0 | 0 | 0 | P |
| 5 | | | | NT* | 5 | 0 | 0 | 0 | P | 5 | 0 | 0 | 0 | P |
| Total Afterflame Test Result | 0 | | | FAILED | Total Afterflame Test Result | 1 | | | PASSED | Total Afterflame Test Result | 1 | | | PASSED |

*NT-not tested due to earlier failure of material.

TABLE 3

| Coating Weights Ounces Per Square Yard (OPSY) | | | | | | | | |
|---|---|---|---|---|---|---|---|---|
| Unplated OPSY | Plated OPSY | Metal Weight | Urethaned (U) OPSY | U Weight | 911 OPSY | 911 Weight | U/911 OPSY | 911 Weight |
| 2.10 | 2.93 | 0.83 | 3.157 | 0.227 | 5.024 | 2.094 | 4.728 | 1.571 |

| Surface Resistivity | | | |
|---|---|---|---|
| Uncoated 4-Point | U 4-Point | 911 4-Point | U/911 4-Point |
| 0.1036 ohm/sq. | 0.3519 ohm/sq. | 0.1973 ohm/sq. | 0.4483 ohm/sq. |

Figure 2:
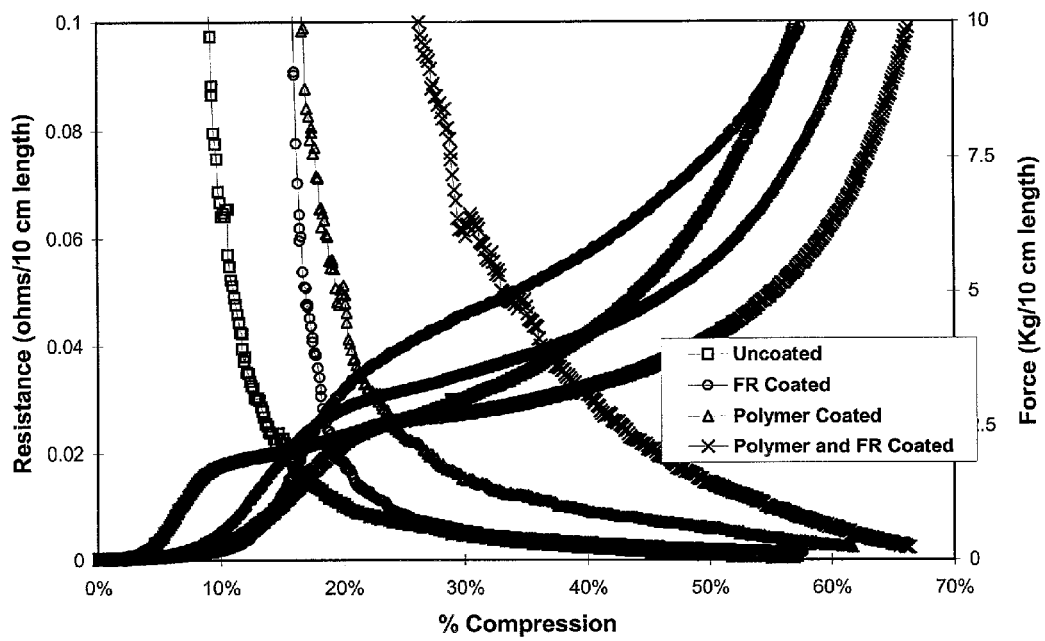
FIG. 2 is a force displacement resistance graph illustrating bulk resistance as a function of material compression for shielding materials (1.75 mm foam) with a dispersed flame retardant in accordance with the invention: uncoated control (-□-); polymer coated (-▲-); flame retardant ("FR") coated (-●-); and polymer and flame retardant (-✳-).
Figure 3:
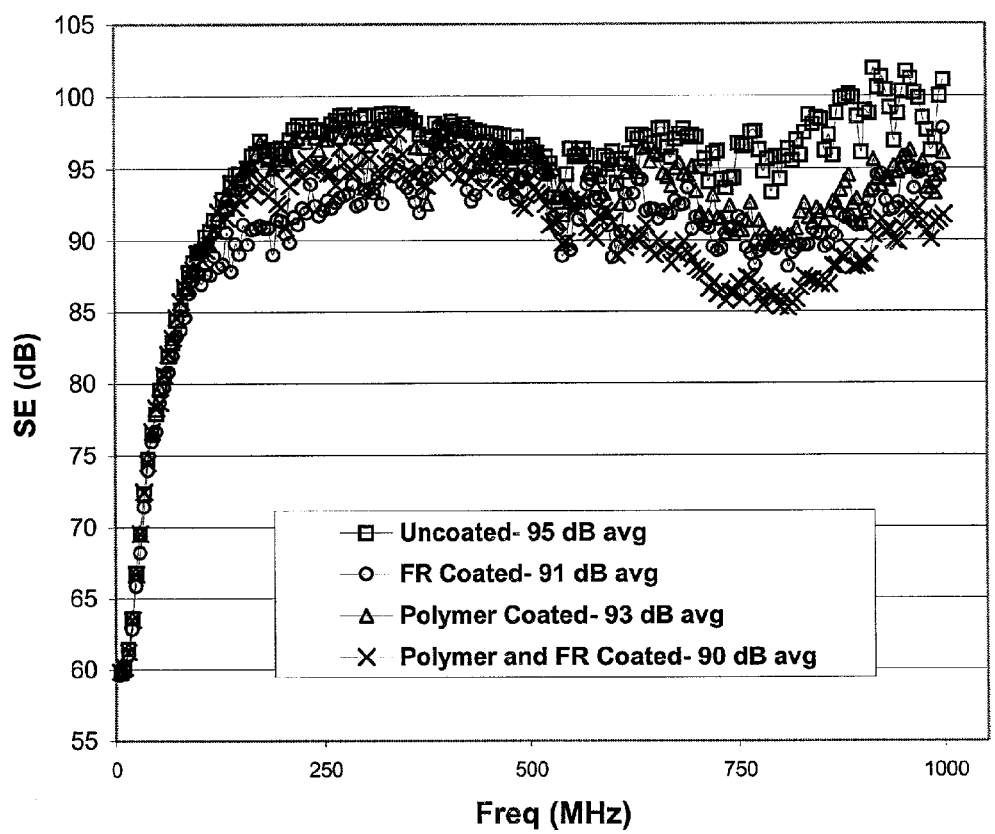
FIG. 3 is a plot graph illustrating far field shielding effectiveness (SE) as a function of frequency for shielding materials (1.5 mm fabric-on-foam) with a dispersed flame retardant in accordance with the invention: uncoated control (-□-); polymer coated (-▲-); flame retardant ("FR") coated (-●-); and polymer and flame retardant (-✳-).
Figure 4:
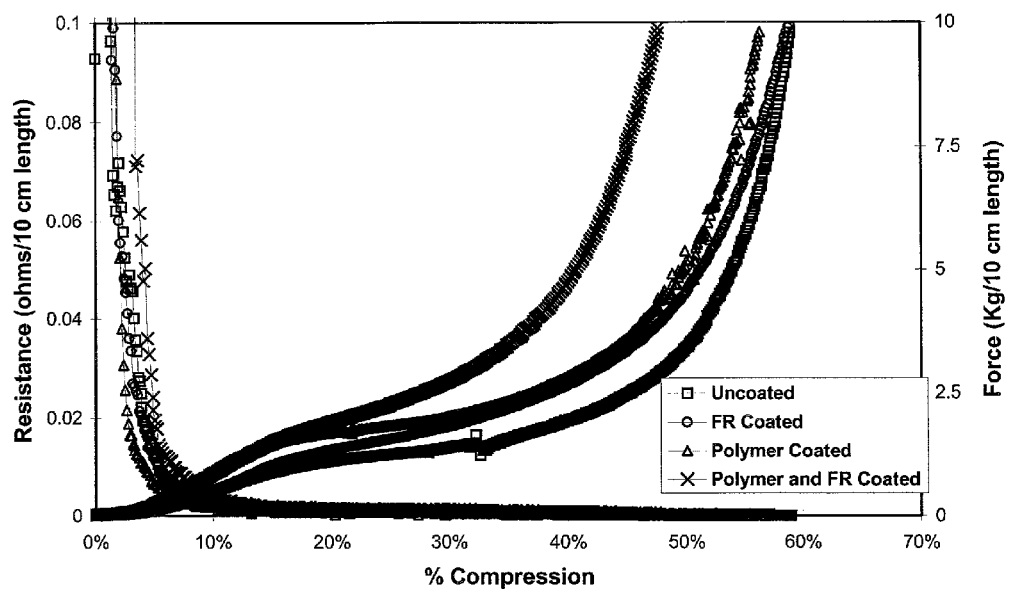
FIG. 4 is a force displace resistance graph illustrating bulk resistance as a function of material compression for shielding materials (1.5 mm fabric-on-foam) with a dispersed flame retardant in accordance with the invention: uncoated control (-□-); polymer coated (-▲-); flame retardant ("FR") coated (-●-); and polymer and flame retardant (-✳-).

The data in Table 3 and FIGS. 1 and 2 show that foam shielding materials provided with a dispersed flame retardant exhibited properties substantially unchanged from the control. For example, the surface resistivities of the coated materials exhibited approximately a 4.3 fold increase at most (0.4483 ohm/sq.÷0.1036 ohm/sq.=4.3). As shown, in FIG. 1, shielding effectiveness of the materials decreased by no more 23 percent. Likewise, FIG. 2 shows that the force resistance patterns of the control and flame retardant samples were similar.

than 10 percent of the internal surface area. The particulate was also determined to contain a phosphorous material which correlates to the ammonium phosphate salt found in Apex 911. The surface resistivities, coating weights, and UL94 V0 flame retardance of the coated materials and of an uncoated control are listed in Table 4. The shielding effectiveness of the materials along with the force resistance characteristics of the samples are shown in FIGS. 3 and 4, respectively.

TABLE 4

| | Uncoated | Urethane Only | Urethane + 911 | 911 only |
|---|---|---|---|---|
| 4-Point Resistivity | 0.014 ohm/sq. | 0.028 ohm/sq. | 0.038 ohm/sq. | 0.022 ohm/sq. |
| OPSY | 7.35 | 7.63 − 7.35 = 0.28 | 10.68 − 7.63 = 3.05 | 2.75 |
| UL94 V0 Burn Test | Failed | Failed | Passed | Passed |

Example 3

Samples of a wholly conductive fabric-on-foam shielding material as in Example 1 having a thickness of 1.5 mm were impregnated with undiluted Apex 911 (with and without urethane) and with urethane alone. The material was obtained from a line run of Laird Technologies fabric-on- The data in Table 4 and FIGS. 3 and 4 show that fabric-on-foam shielding materials provided with the flame retardant exhibited shielding capabilities substantially unchanged from the control. The surface resistivities of the coated material exhibited less than 3 fold increase at most (0.038 ohm/sq.÷0.014 ohm/sq.=2.71). As shown in FIG. 3, the control sample exhibited an average shielding effectiveness of 95 dB while the samples with flame retardant alone and with a urethane precoating in addition to the flame retardant exhibited 91 and 90 dB, respectively, which is less than a 10 percent decrease in shielding effectiveness. Likewise, FIG. 4 shows that the force resistance patterns of the control and flame retardant samples are substantially similar.

We claim:

1. A flame retardant electrically conductive EMI shielding material comprising a porous material having internal interstices, the internal surfaces of which are electrically conductive, and said interstices containing an effective amount of a flame-retardant, wherein said shielding material is substantially free of occluded interstices, wherein said effective amount of flame retardant is an amount that provides said shielding material with at least horizontal flame rating while at the same time retaining z-axis conductivity or bulk resistivity sufficient for EMI shielding applications; and wherein said interstices are electrically conductive due to at least one conductive layer selected from the group consisting of a metal layer and a conductive non-metal layer.

2. The shielding material of claim 1, wherein said conductive layer is a metallized layer.

3. The shielding material of 2, wherein the metal for said metallized layer is selected from the group consisting of copper, nickel, silver, palladium, platinum, nickel-plated-silver, aluminum, tin, and alloys thereof.

4. The shielding material of claim 1, wherein said flame-retardant is in the form of a particulate dispersed throughout said interstices of said shielding material.

5. The shielding material of claim 1, wherein said flame-retardant is in the form of a particulate occupying no more than about 30% of the total internal surface area defined by said interstices.

6. The shielding material of claim 5, wherein said particulate occupies no more than about 20% of said internal surface area.

7. The shielding material of claim 6, wherein said particulate occupies no more than about 10% of said internal surface area.

8. The shielding material of claim 1, wherein said flame-retardant is in the form of a coating on the internal surfaces of the interstices.

9. The shielding material of claim 8, wherein said coating has a thickness of about 12 microns or less.

10. The shielding material of claim 9, wherein said thickness is about 5 microns or less.

11. The shielding material of claim 10, wherein said thickness is about 2 microns or less.

12. The shielding material of claim 1, wherein said shielding material has a bulk resistivity of about 20 ohm·cm or less.

13. The shielding material of claim 12, wherein said bulk resistivity is about 1 ohm·cm or less.

14. The shielding material of claim 13, wherein said bulk resistivity is about 0.5 ohm·cm or less.

15. The shielding material of claim 1, wherein said porous material is an open-cell foam having at least one metallized layer throughout.

16. The shielding material of claim 15, wherein said foam further includes a porous scrim.

17. The shielding material of claim 16, wherein said foam is a polyurethane foam.

18. The shielding material of claim 1, wherein said effective amount of said flame retardant provides said shielding material a UL94 flame rating of at least HF-1.

19. The shielding material of claim 18, wherein said shielding material exhibits a UL94 flame rating of at least HB.

20. The shielding material of claim 19, wherein said shielding material exhibits a UL94 flame rating of at least V2.

21. The shielding material of claim 20, wherein said shielding material exhibits a UL94 flame rating of at least V1.

22. The shielding material of claim 21, wherein said shielding material exhibits a UL94 flame rating of V0.

23. The shielding material of claim 1, said flame retardant is a phosphorous-based flame retardant.

24. The shielding material of claim 23, wherein said flame retardant is an ammonium phosphate salt.

25. The shielding material of claim 23, wherein said flame retardant is halogen free.

26. The shielding material of claim 1, wherein said flame retardant further includes a polymeric carrier.

27. The shielding material of claim 26, wherein the polymeric carrier is water-soluble or water-dispersible polymer.

28. The shielding material of claim 1, wherein said shielding material has an average shielding effectiveness of at least about 65 decibels.

* * * * *